(12) United States Patent
Yin et al.

(10) Patent No.: US 11,215,660 B1
(45) Date of Patent: Jan. 4, 2022

(54) APPARATUS FOR INTERFACING WITH A DISPLAY PANEL COMPATIBLE WITH A MOBILE INDUSTRY PROCESSOR INTERFACE

(71) Applicant: Facebook Technologies, LLC, Menlo Park, CA (US)

(72) Inventors: Ye Yin, Pleasanton, CA (US); Rui Zhang, Sunnyvale, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 243 days.

(21) Appl. No.: 16/508,286

(22) Filed: Jul. 10, 2019

Related U.S. Application Data

(60) Provisional application No. 62/851,077, filed on May 21, 2019.

(51) Int. Cl.
| | |
|---|---|
| *G01R 31/28* | (2006.01) |
| *G09G 3/00* | (2006.01) |
| *G01R 1/067* | (2006.01) |
| *G02F 1/13* | (2006.01) |
| *H01R 12/79* | (2011.01) |
| *G01R 1/04* | (2006.01) |

(52) U.S. Cl.
CPC ....... *G01R 31/2825* (2013.01); *G01R 1/0416* (2013.01); *G01R 1/06722* (2013.01); *G02F 1/1309* (2013.01); *G09G 3/006* (2013.01); *H01R 12/79* (2013.01); *H01R 2201/20* (2013.01)

(58) Field of Classification Search
CPC ....... H01L 21/00; H01L 2221/00; G01R 1/00; H05K 1/00; H05K 2201/00; H01R 3/00; H01R 2101/00
See application file for complete search history.

(56) References Cited

U.S. PATENT DOCUMENTS

| | | | |
|---|---|---|---|
| 2014/0167799 A1* | 6/2014 | Wang | H05K 1/11 324/750.14 |
| 2014/0184257 A1* | 7/2014 | Caradonna | G01R 1/0408 324/750.24 |
| 2015/0241471 A1* | 8/2015 | Hsu | G01R 1/07371 324/756.07 |
| 2016/0077129 A1* | 3/2016 | Audette | G01R 1/07357 324/756.03 |

* cited by examiner

*Primary Examiner* — Jermele M Hollington
*Assistant Examiner* — Temilade S Rhodes-Vivour
(74) *Attorney, Agent, or Firm* — FisherBroyles, LLP

(57) ABSTRACT

The disclosed computer-implemented method may include providing test signals from a panel test board included in a fixture to a device under test included in a carrier including providing interface signals from the panel test board to a connector included on a fixture interposer block included in the fixture, interfacing the connector on the fixture interposer block with one or more pogo pins included on a panel interposer board included in the carrier, the interfacing providing the interface signals as inputs to a re-timer circuit included on the panel interposer board, generating, by the re-timer circuit, output interface signals whose signal strength is greater than a signal strength of the interface signals input to the re-timer circuit, and providing the interface signals output from the re-timer circuit to the device under test. Various other methods, systems, and computer-readable media are also disclosed.

20 Claims, 12 Drawing Sheets

APPARATUS FOR INTERFACING WITH A DISPLAY PANEL COMPATIBLE WITH A MOBILE INDUSTRY PROCESSOR INTERFACE

CROSS REFERENCE TO RELATED APPLICATION

This application claims the benefit of U.S. Provisional Application No. 62/851,077, filed May 21, 2019, the disclosures of each of which are incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
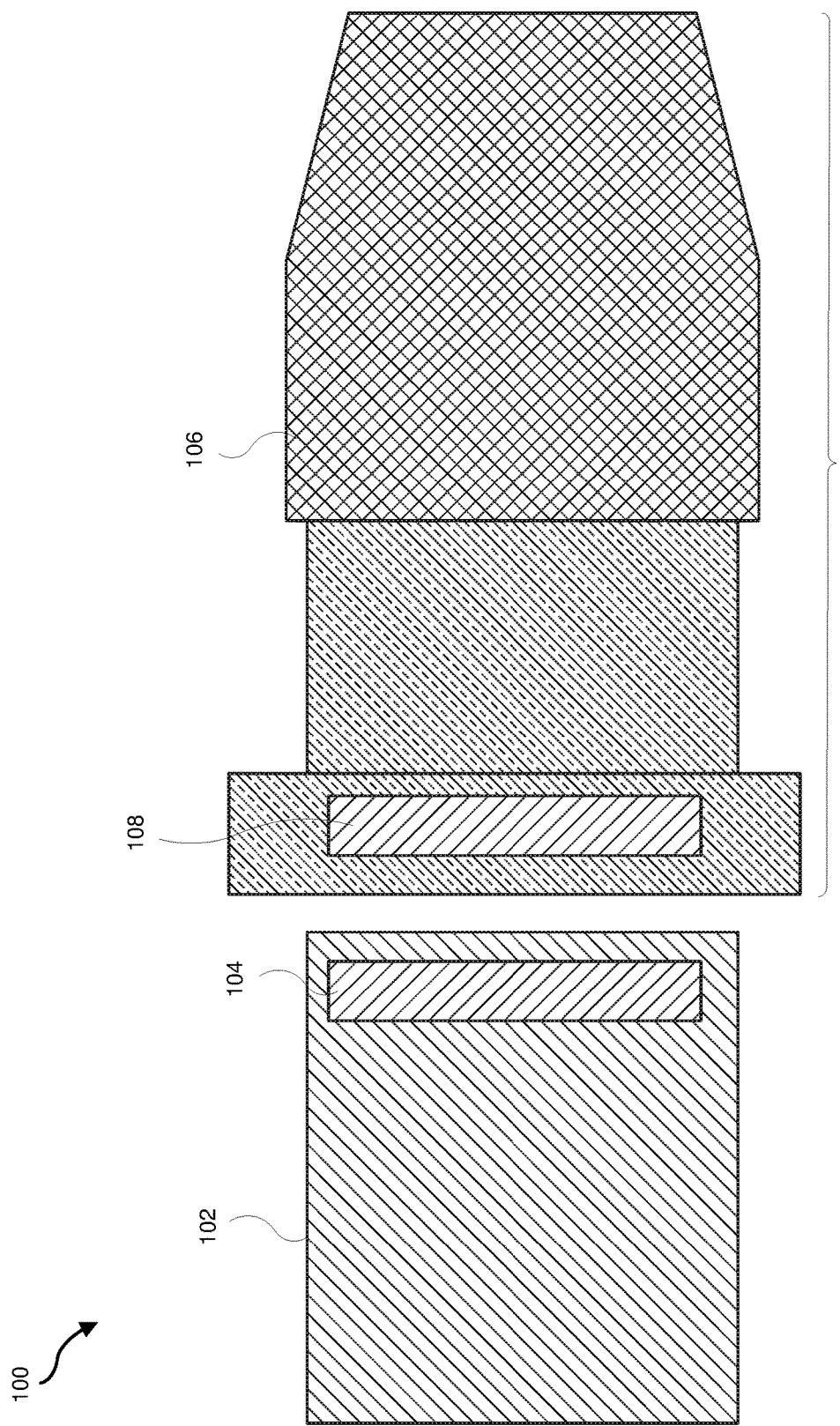
FIG. 1 is a block diagram showing an example panel test board including an example panel test board connector and an example device under test including a device under test connector.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

A device may be subject to multiple tests before use. For example, during a manufacturing process, one or more devices or subassemblies may be individually tested many times before being incorporated into a final assembly or product. As each device is tested, a test board or fixture may be connected to the device. The connection between a test board and a device under test (DUT) may be between a connector included on the DUT and another connector. In some cases, the other connector may be included on the test board. In some cases, a cable may be used to connect the DUT to the test board. The connecting to and the disconnecting from the connector on the DUT many times during testing (e.g., ten times, thirty times, fifty times) may cause undo wear and tear on, and in some cases may damage, the connector on the DUT, damaging the DUT.

In some implementations, the interface between the test board and the DUT may include one or more signals that may be sensitive to noise, electromagnetic interference (EMI), or that may be affected by a length of a connection between signals of the test board and the DUT. As such, a length of a signal path between the DUT and the test board may be taken into consideration when designing testing apparatus for a DUT.

The present disclosure is generally directed to systems and apparatuses that implement an intermediate hardware shield to enable testing of a DUT without the need to connect to and disconnect from a connector on the DUT during testing while maintaining signal strength integrity between the test board and the DUT.

As will be explained in greater detail below, embodiments of the present disclosure describe an intermediate hardware shield that may include a test fixture and a panel interposer board. The panel interposer board may be included in a carrier base plate that includes the DUT. The carrier base plate may enable the connecting of the panel interposer board to the DUT by interfacing (plugging in) a connector on the panel interposer board a connector on the DUT. The panel interposer board may include pogo pins that may be used to establish a connection to the test fixture interposer block. The panel interposer board may provide the signals received by the pogo pins to the panel interposer board connector that then provides the signals to the DUT.

In general, an interposer board may include an interposer that may provide an electrical interface between a device under test and a test board (test fixture) that routes and/or reroutes signals between the device under test and the test board. In some cases, an interposer may spread a connection to a wider pitch. In some cases, an interposer may reroute signals from one connection to another connection.

In general, the use of one or more pogo pins included on the panel interposer board for use in connecting to the device under test may allow for the establishing of, for example, a temporary connection between the device under test and the test board. Pogo pins may allow for high fidelity and high reliability temporary connections across many mating/unmating (connecting/disconnecting) cycles while minimizing any wear and tear on connectors included in the device under test and the test board. In some implementations, one or more nodes included in the test fixture interposer block may be connected to respective pogo pins included on the panel interposer board connector when pressed against the respective pogo pins. In some implementations, one or more nodes included in the panel interposer board connector may be connected to respective pogo pins included on the test fixture interposer block when pressed against the respective pogo pins.

The test fixture may include a panel test board, a connection board, and an interposer connection block (e.g., an interposer board). Circuitry and connectors included on the connection board may provide test signals from the panel test board to the interposer connection block. The interposer connection block may include one or more connectors that may interface with (connect to) the pogo pins on the panel interposer board. The connection board may include circuitry configured to separate and/or spread signals output from the panel test board for input to the interposer connection block. In some implementations, the connection board may widen the pitch of the signals output from the panel test board to one or more connectors included in the interposer block. In some implementations, the connection board may reroute signals output from the panel test board to one or more connectors included in the interposer block.

Multiple test fixtures may be connected to (interfaced with) the panel interposer board by way of the pogo pins for testing the DUT in the carrier base plate enabling the testing of the DUT multiple times (e.g., ten, twenty, thirty, etc.), each time with a different test fixture, without each test fixture interfacing with (connecting to) the connector on the DUT. The use of the test fixture, the panel interposer board, and the carrier base plate when performing multiple tests of a DUT may reduce if not eliminate wear and tear and/or possible damage to the connector on the DUT because the use of the carrier base plate with the panel interposer board results in a single connection with the connector on the DUT while the use of the test fixture allows multiple test fixtures to interface with the DUT during, for example, a manufacturing process. In addition, or in the alternative, the panel interposer board may include one or more circuits that may strengthen Mobile Industry Processor Interface (MIPI) signals to the DUT whose signal strength may be degraded (reduced) by circuit(s) and/or connector(s) included between output signals from the panel test board on the test fixture interposer board and the input signals to the DUT.

Features from any of the embodiments described herein may be used in combination with one another in accordance with the general principles described herein. These and other embodiments, features, and advantages will be more fully understood upon reading the following detailed description in conjunction with the accompanying drawings and claims.

FIG. 1 is a block diagram showing an example system 100 including an example panel test board 102 including an example panel test board connector 104 and an example device under test 106 including a device under test connector 108. The device under test 106 and the device under test connector 108 are included in a device under test panel 110. In order to test the device under test 106, one or more panel test boards may connect to and/or may be disconnected from the device under test connector 108. The connecting to and the disconnecting from the device under test connector 108 many times during testing of the device under test 106 may cause undo wear and tear on, and in some cases may damage, the device under test connector 108, in turn damaging the device under test 106.

Figure 2:
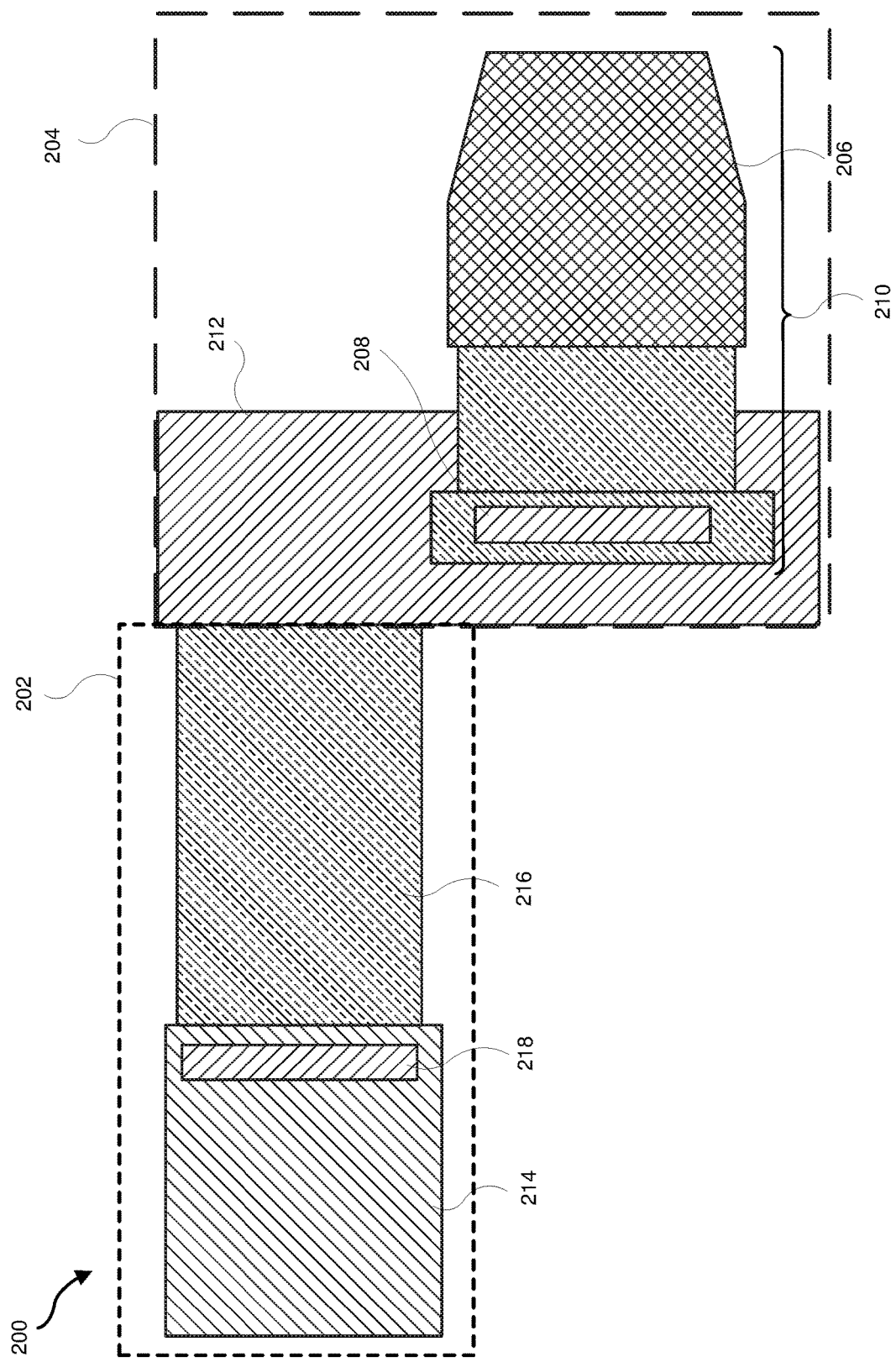
FIG. 2 is a block diagram showing an example system including an example test fixture interfaced to an example carrier including a device under test.

FIG. 2 is a block diagram showing an example system 200 including an example test fixture 202 interfaced to an example carrier 204 including a device under test 206. The device under test 206 may be included in a device under test panel 210. The device under test panel 210 may include a device under test connector 208. The device under test connector 208 may be connected to a socket on a panel interposer board 212. The panel interposer board 212 may interface with (connect to) a fixture interposer board included in the test fixture 202 by way of pogo pins included on the panel interposer board 212. One or more test signals from a panel test board 214 may be provided to respective pogo pins included on the panel interposer board 212 using a flexible flat cable 216. The flexible flat cable 216 may connect to (interface with) a panel test board connector 218 included on the panel test board 214 and may connect to (interface with) one or more pogo pins included on the panel interposer board 212.

Multiple test fixtures may be connected to (interfaced with) the panel interposer board 212 by way of the pogo pins for testing the device under test 206 without each panel test board connector interfacing with (connecting to and disconnecting from) the device under test connector 208. The use of the test fixture 202 including the flexible flat cable 216 and the carrier 204 including the panel interposer board 212 allows the pogo pins on the panel interposer board 212 to interface with (connect to) the flexible flat cable 216 enabling test signals output from the panel test board 214 to be input to the device under test 206.

Figure 3:
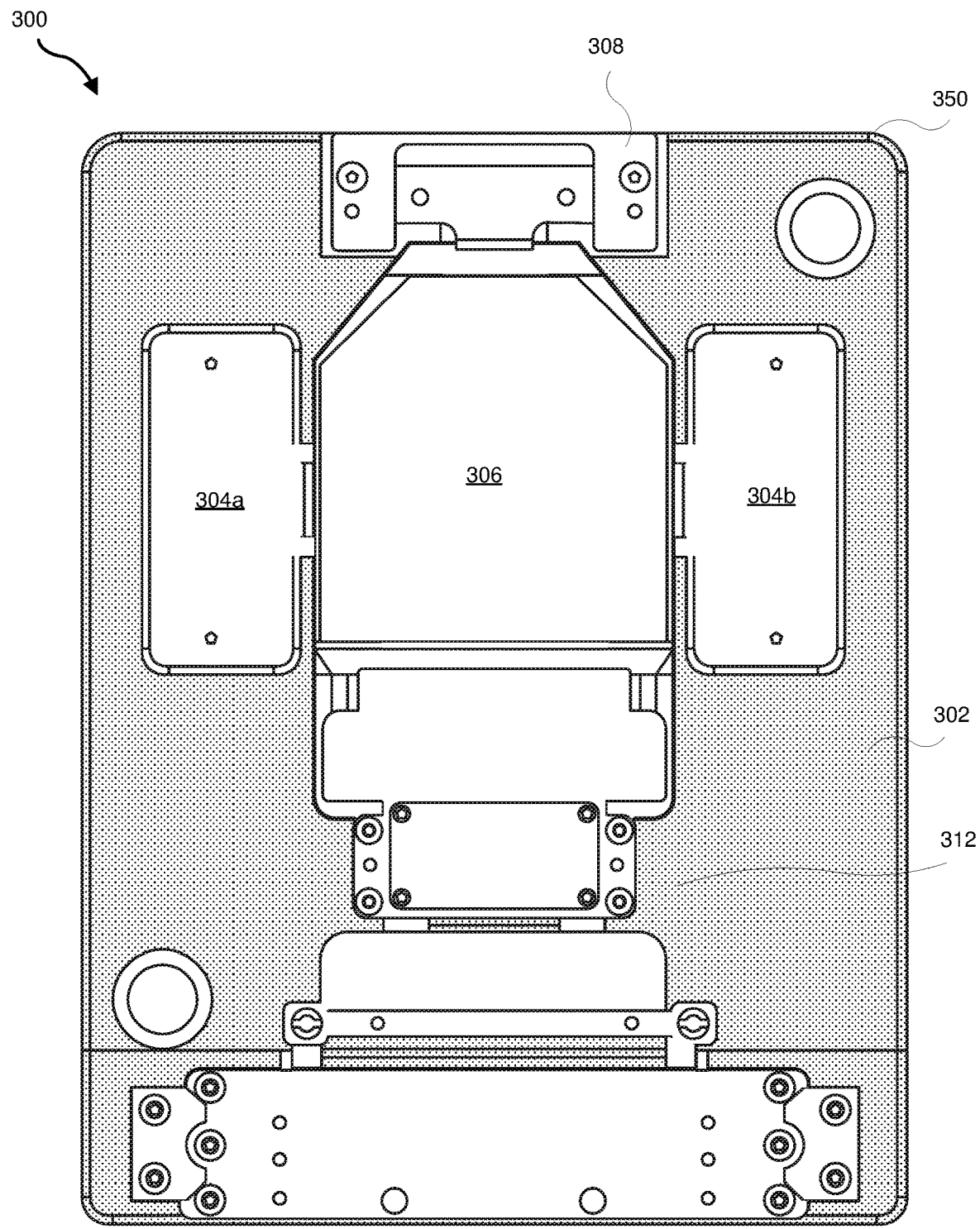
FIG. 3 is a block diagram showing an example top view of a carrier for a device under test.

FIG. 3 is a block diagram showing an example top view 300 of a carrier 350 for a device under test 306. The carrier 350 includes a carrier base plate 302. Placed in the carrier base plate 302 are the device under test 306 (e.g., the device under test 206) and a panel interposer board 312 (e.g., the panel interposer board 212). A buckle 308 and fasteners 304a-b may fasten (affix) the device under test 306 to the carrier base plate 302.

Figure 4:
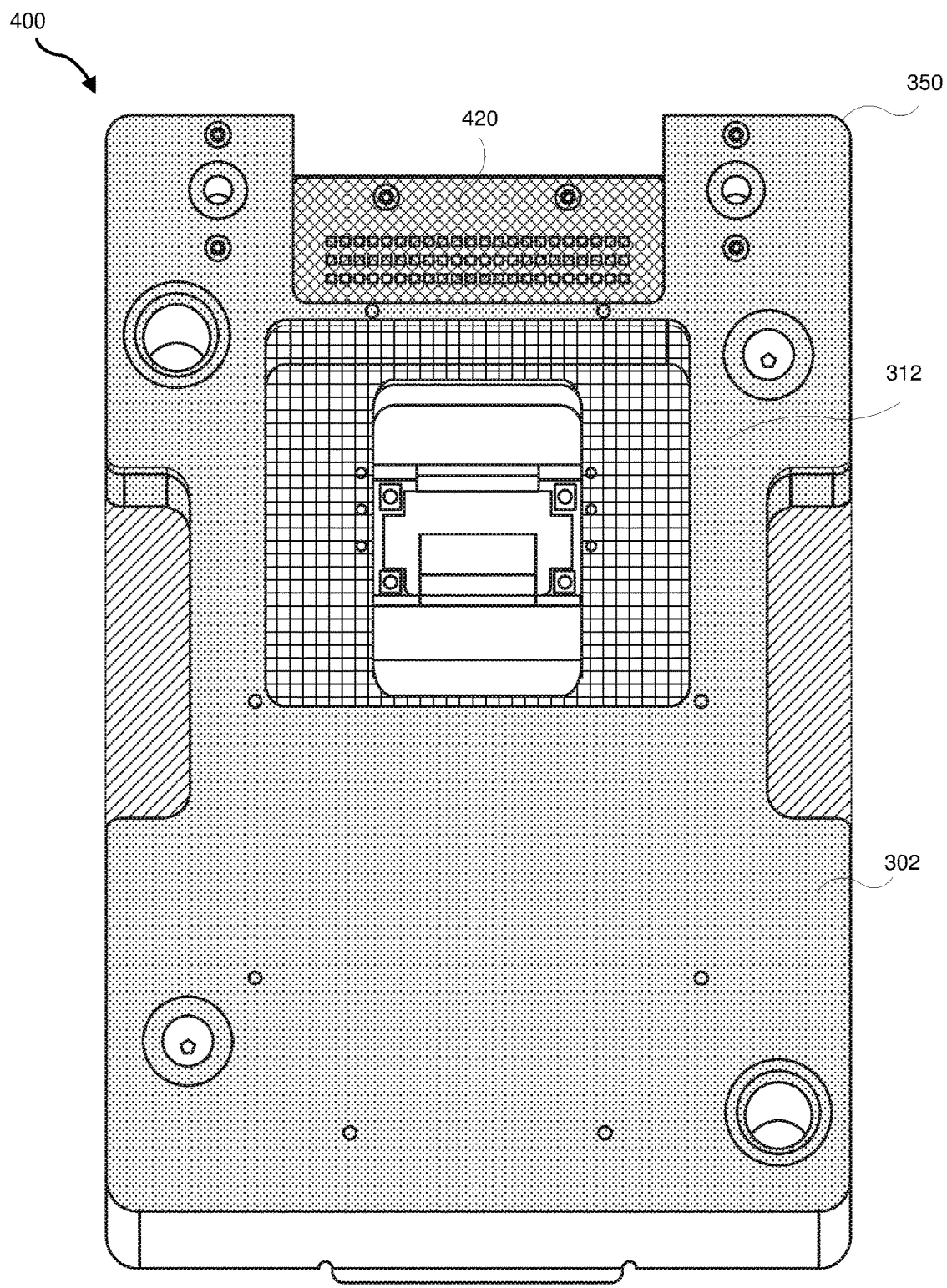
FIG. 4 is a block diagram showing an example bottom view of a carrier for a device under test.

FIG. 4 is a block diagram showing an example bottom view 400 of the carrier 350 for the device under test 306. One or more pogo pins 420 may be accessible from the bottom of the carrier 350 for interfacing with an interposer block included in a test fixture. Further details for the carrier 350 are described with reference to FIG. 5.

Figure 5:
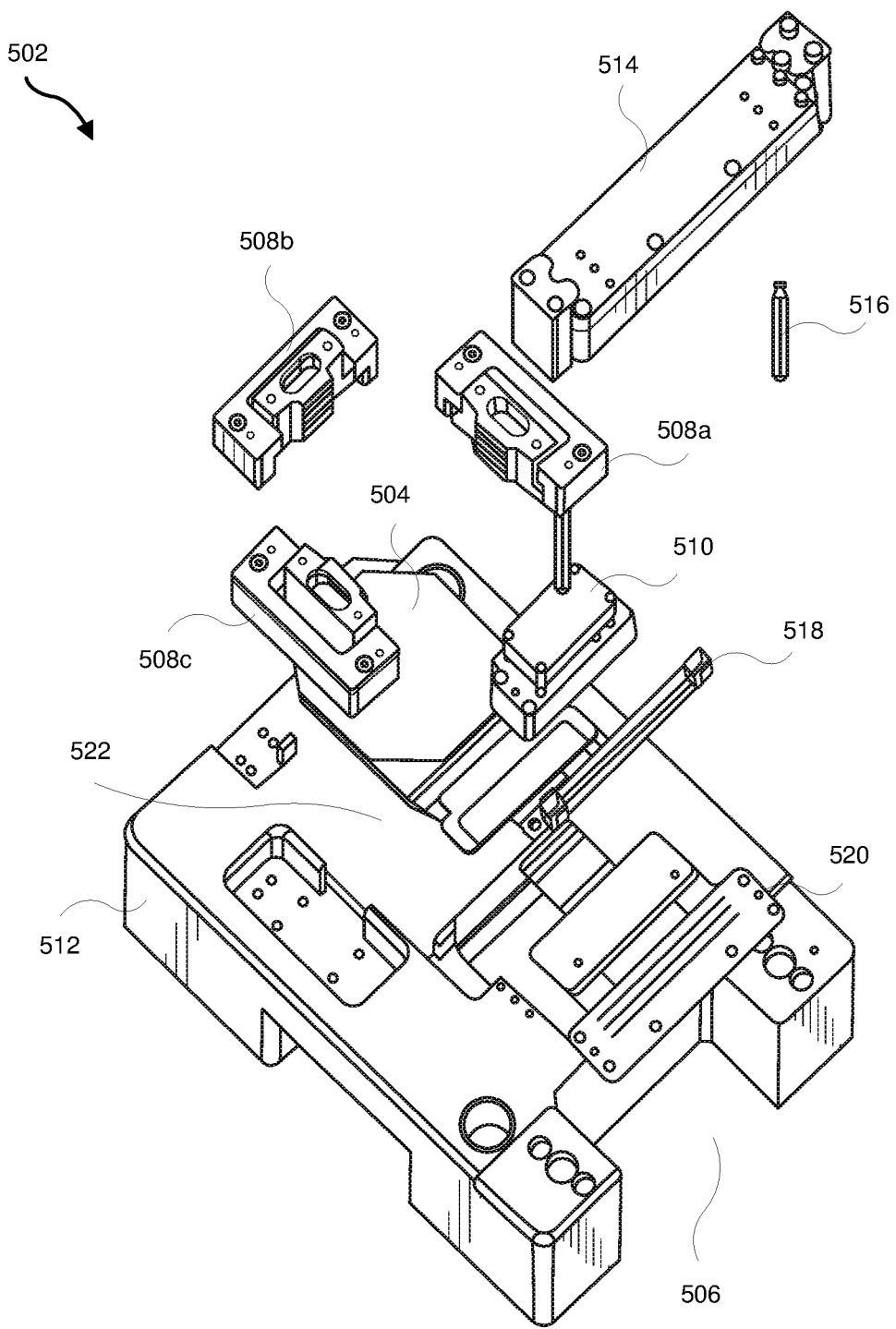
FIG. 5 is a block diagram showing a breakout view of a carrier for a device under test.

FIG. 5 is a block diagram showing a breakout view of a carrier 502 (e.g., the carrier 350) for a device under test 504 (e.g., the device under test 306, the device under test 206). The carrier 502 may include a recess 522 for holding (incorporating) the device under test 504. In some implementations, the device under test 504 may be a display device such as a liquid crystal display (LCD). The carrier 502 may include a recess 506 for holding (incorporating) a panel interposer board 520 (e.g., referring to FIG. 3, the panel interposer board 312, referring to FIG. 2, the panel interposer board 212). The carrier 502 may include one or more fasteners 508a-c (e.g., referring to FIG. 3, fasteners 304a-b), a buckle 510 (e.g., referring to FIG. 3, the buckle 308), a carrier base plate 512 (e.g., referring to FIGS. 3 and 4, carrier base plate 302), a panel interposer board press module 514, a guide pin 516, and a press plate 518.

The fasteners 508a-c and the buckle 510 may secure the device under test 504 within the recess 522 in the carrier base plate 512. In some implementations, a multistep (e.g., a two-step) alignment procedure may be performed when securing the device under test 504 within the recess 522 in the carrier base plate 512 to account for variations between devices under test as well as variations to accommodate for variations between carrier base plates (and therefore variations in recesses). For example, the buckle 510 may be designed so that when set into the recess 522 there may be room for adjustment within the recess 522 (e.g., the buckle 510 may not be mechanically constrained for placement within the recess 522). The adjustment leeway may accommodate for variations in mechanical dimensions of the recess and the device under test.

The panel interposer board press module 514, the guide pin 516, and the press plate 518 may secure the panel interposer board 520 in the recess 506. Referring to FIG. 2 and FIG. 4, the test fixture 202, and specifically the one or more connectors on the flexible flat cable 216, may connect to (interface with) the pogo pins 420 that are accessible from the carrier 502.

Figure 6:
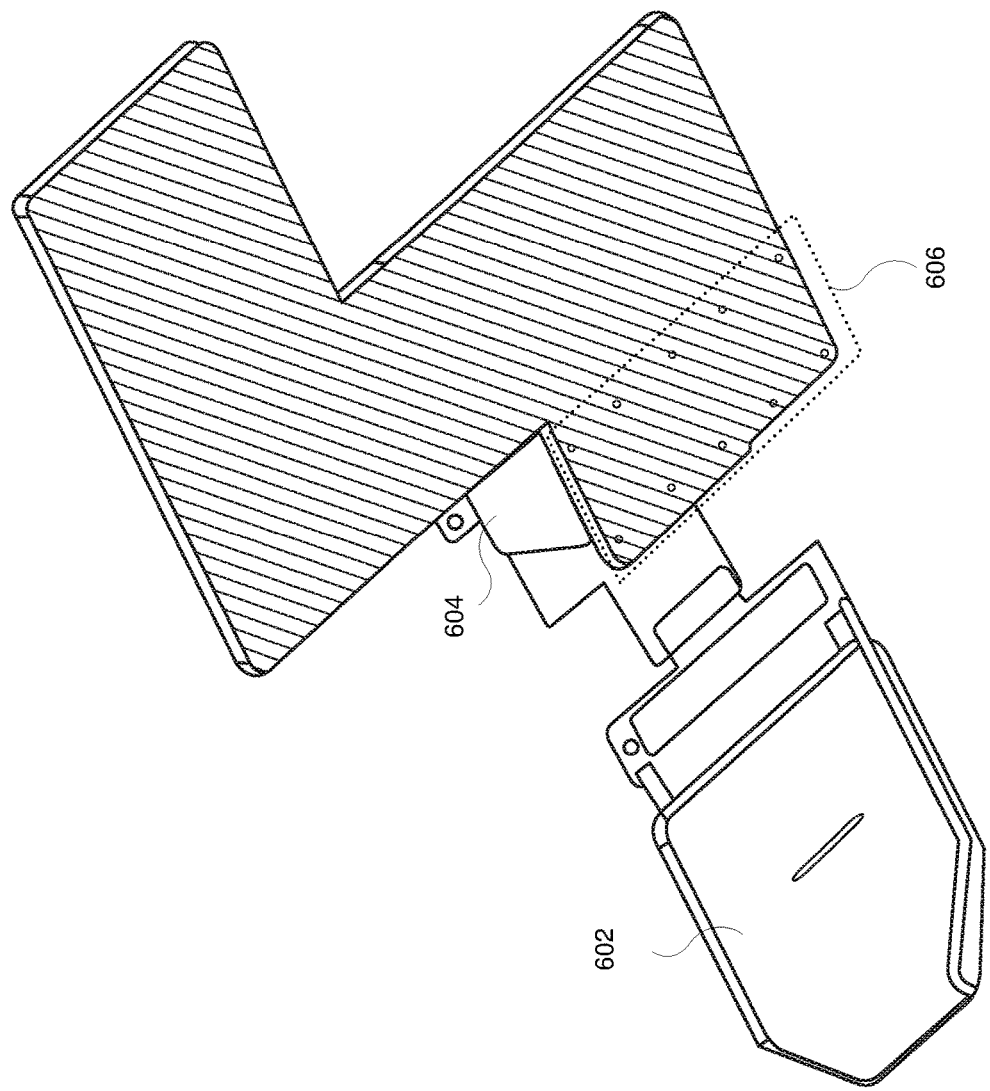
FIG. 6 is a block diagram showing an example connection path for a device under test that includes a panel interposer board included in a carrier interfacing with an interposer block included in a test fixture.

FIG. 6 is a block diagram showing an example connection path 600 for a device under test 602 that includes a panel interposer board 604 included in a carrier interfacing with an interposer block 606 included in a test fixture. Referring to FIG. 2, the test fixture 202 may include an interposer block that includes one or more connectors for connecting the flexible flat cable 216 and for interfacing with (connecting to) one or more pogo pins included on the panel interposer board 212.

Figure 7:
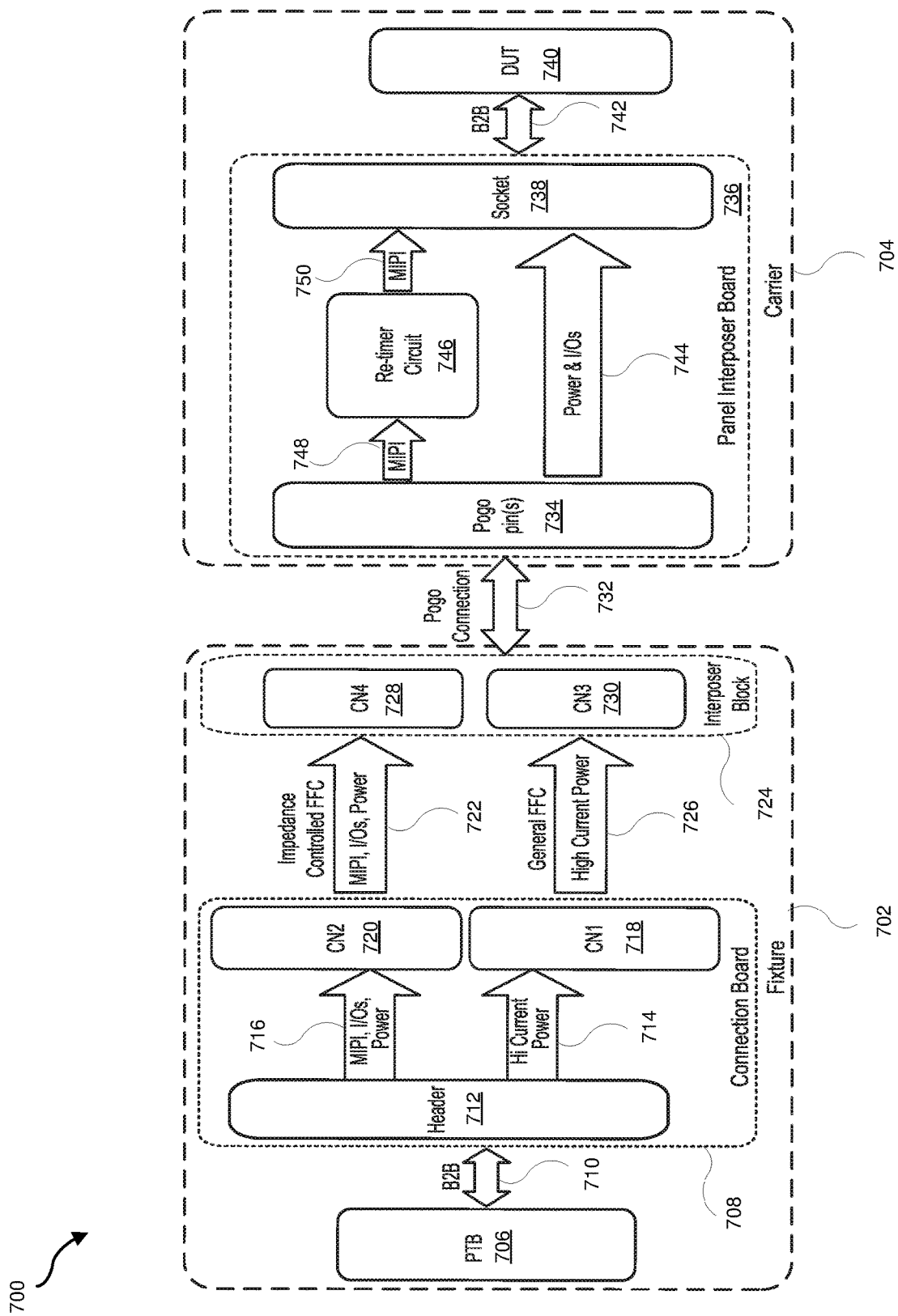
FIG. 7 is a block diagram of an example system showing an example test fixture interfaced with an example carrier.

FIG. 7 is a block diagram of a system 700 showing an example test fixture 702 interfaced with (connected to) an example carrier 704. A panel test board (PTB) 706 may be connected to (interfaced with) a panel test board (PTB) connection board 708 by way of a board to board (B2B) connection 710 from the panel test board 706 to a header 712 included on the PTB connection board 708. The header 712, a first connector (CN1) 718, and a second connector CN2) 720 may be included in the PTB connection board 708 included in the test fixture 702. The connection board 708 may divide (split) signals received from the panel test board 706 by way of the header 712 into a first set of signals 714 and a second set of signals 716. The first set of signals 714 may include high current power signals. The second set of signals 716 may include mobile industry processor interface (MIPI) signals, input/out (I/O) signals, and/or general power signals. The first set of signals 714 may be provided to the first connector 718. The second set of signals 716 may be provided to the second connector 720. An impedance controlled flexible flat cable (impedance controlled FFC) 722 may provide a connection between the second connector 720 and a fourth connector (CN4) 728 included on an interposer block 724 included on the test fixture 702. A general flexible flat cable (general FFC) 726 may provide a connection between the first connector 718 and a third connector (CN3) 730 included on the interposer block 724.

For example, referring to FIG. 2, the flexible flat cable 216 may represent the general flexible flat cable 726 and the impedance controlled flexible flat cable 722. The third connector 730 and the fourth connector 728 included in the interposer block 724 may each be configured to provide a pogo connection 732 between the interposer block 724 and one or more pogo pin(s) 734 included on a panel interposer board 736 included in the carrier 704. In general, the third connector 730 and the fourth connector 728 included in the interposer block 724 may provide the pogo connection 732 between the test fixture 702 and the carrier 704. One or more of the power and/or I/O signals received on the pogo pin(s) 734 may be provided to a socket 738 included on the panel interposer board 736 by way of power and I/O (Power & I/Os) connection 744. A connector (e.g., the device under test connector 208 as shown in FIG. 2) may connect to (interface with) a device under test 740 by way of a board to board (B2B) connection 742 to the socket 738.

In some implementations, the MIPI signals received on the pogo pin(s) 734 may be provided to a re-timer circuit 746 by way of a first connection 748. As described herein, a signal strength of the MIPI signals generated by the panel test board 706 may be diminished by the various headers, traces, connectors, and/or cables used to provide the MIPI signals from the panel test board 706 to the device under test 740. The re-timer circuit 746 may be used to maintain a signal strength of the MIPI signals for use by the device under test 740. The re-timer circuit 746 may strengthen (e.g., amplify, condition) the MIPI signals received by way of the first connection 748, outputting the stronger MIPI signals by way of the second connection 750. The MIPI signals included in the second connection 750 are provided to respective pins on the socket 738 that connects to (interfaces with) the device under test 740 by way of the board to board connection 742. Though described with reference to MIPI signals, in some implementations, the system 700 may be used to provide any type of test and/or interface signals from a test board to a device under test.

Figure 8:
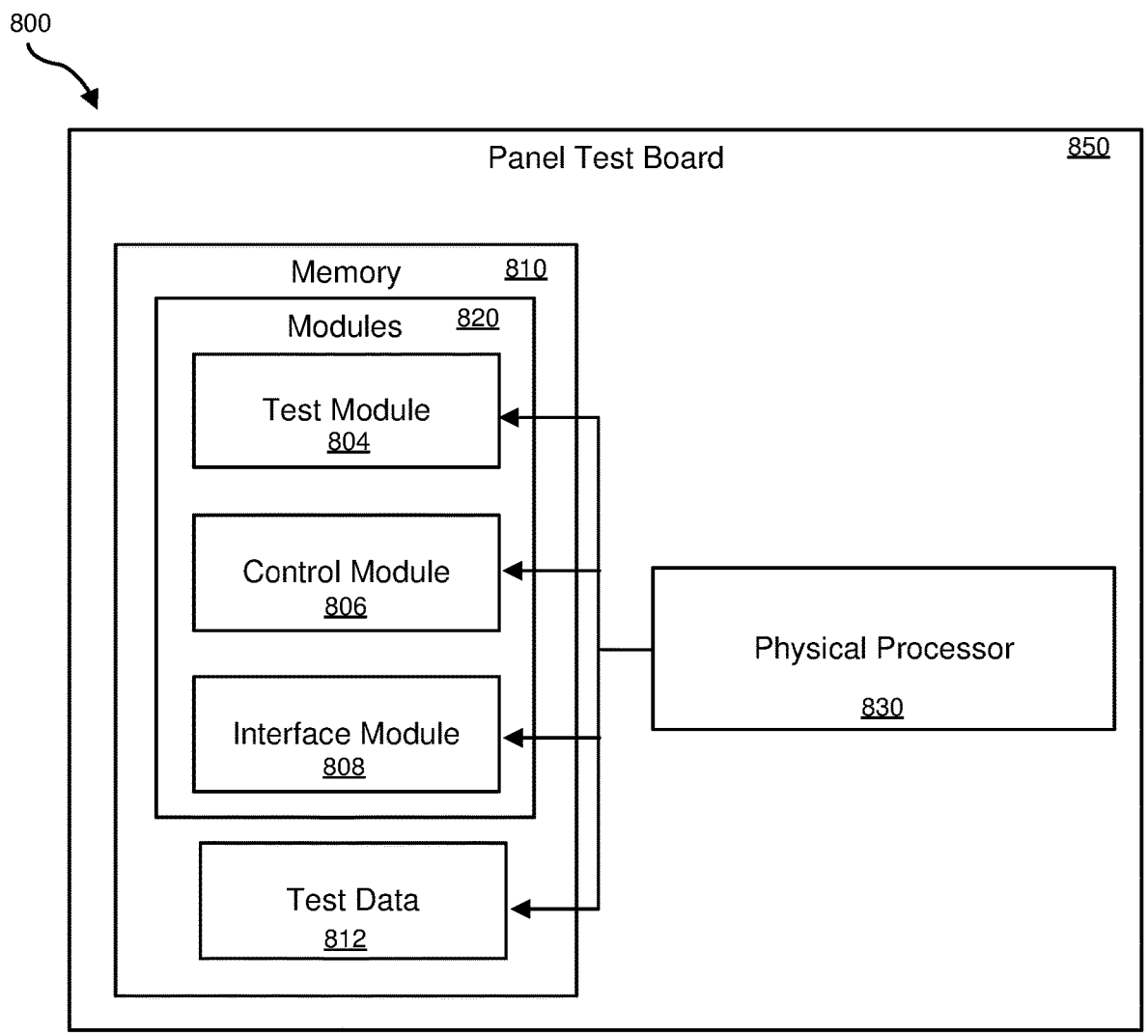
FIG. 8 is a block diagram of an example system that includes modules for use in generating and providing test signals to a device under test.

FIG. 8 is a is a block diagram of an example system 800 that includes modules for use in generating and providing test signals to a device under test. The system 800 may include a panel test board 850 (e.g., referring to FIG. 7, the panel test board 706) that may include one or more modules 820. The modules 820 may include a test module 804, a control module 806, and an interface module 808. Although illustrated as separate elements, one or more of modules 820 in FIG. 8 may represent portions of a single module or application. The test module 804 may implement one or more test applications for use in testing a device under test. The control module 806 may implement one or more controls for implementing the one or more test applications. The control module 806 may determine one or more test signals for sending to a device under test. The interface module 808 may implement the interfaces needed to communicate the test signals to the device under test.

For example, the interface module 808 may implement a Mobile Industry Processor Interface (MIPI) that may include a MIPI C-PHY interface for connecting a processor to the device under test when the device under test is a liquid crystal display device. In this example, referring to FIG. 7, the re-timer circuit 746 may be a MIPI C-PHY re-timer circuit.

For example, when the device under test is a display device, the interface module 808 may implement a Mobile Industry Processor Interface (MIPI) that may include a MIPI D-PHY interface for serial interface for a display device. In this example, referring to FIG. 7, the re-timer circuit 746 may be a MIPI D-PHY re-timer circuit.

In certain embodiments, one or more of modules 820 in FIG. 8 may represent one or more software applications or programs that, when executed by a computing device, may cause the computing device to perform one or more tasks. As illustrated in FIG. 8, example system 800 may also include one or more memory devices, such as memory 810. Memory 810 generally represents any type or form of volatile or non-volatile storage device or medium capable of storing data and/or computer-readable instructions. In one example, memory 810 may store, load, and/or maintain one or more of modules 820. Examples of memory 810 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, and/or any other suitable storage memory.

As illustrated in FIG. 8, example system 800 may also include one or more physical processors, such as physical processor 830. Physical processor 830 generally represents any type or form of hardware-implemented processing unit capable of interpreting and/or executing computer-readable instructions. In one example, physical processor 830 may access and/or modify one or more of modules 820 stored in memory 810. Additionally, or alternatively, physical processor 830 may execute one or more of modules 820. Examples of physical processor 830 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, and/or any other suitable physical processor.

The example system 800 may also include test data 812 stored in the memory 810. In some implementations. the test data 812 may be used by one or more test applications when testing a device under test. In some implementations, the test data 812 may be data obtained from the device under test as a result of testing by one or more test applications.

Figure 9:
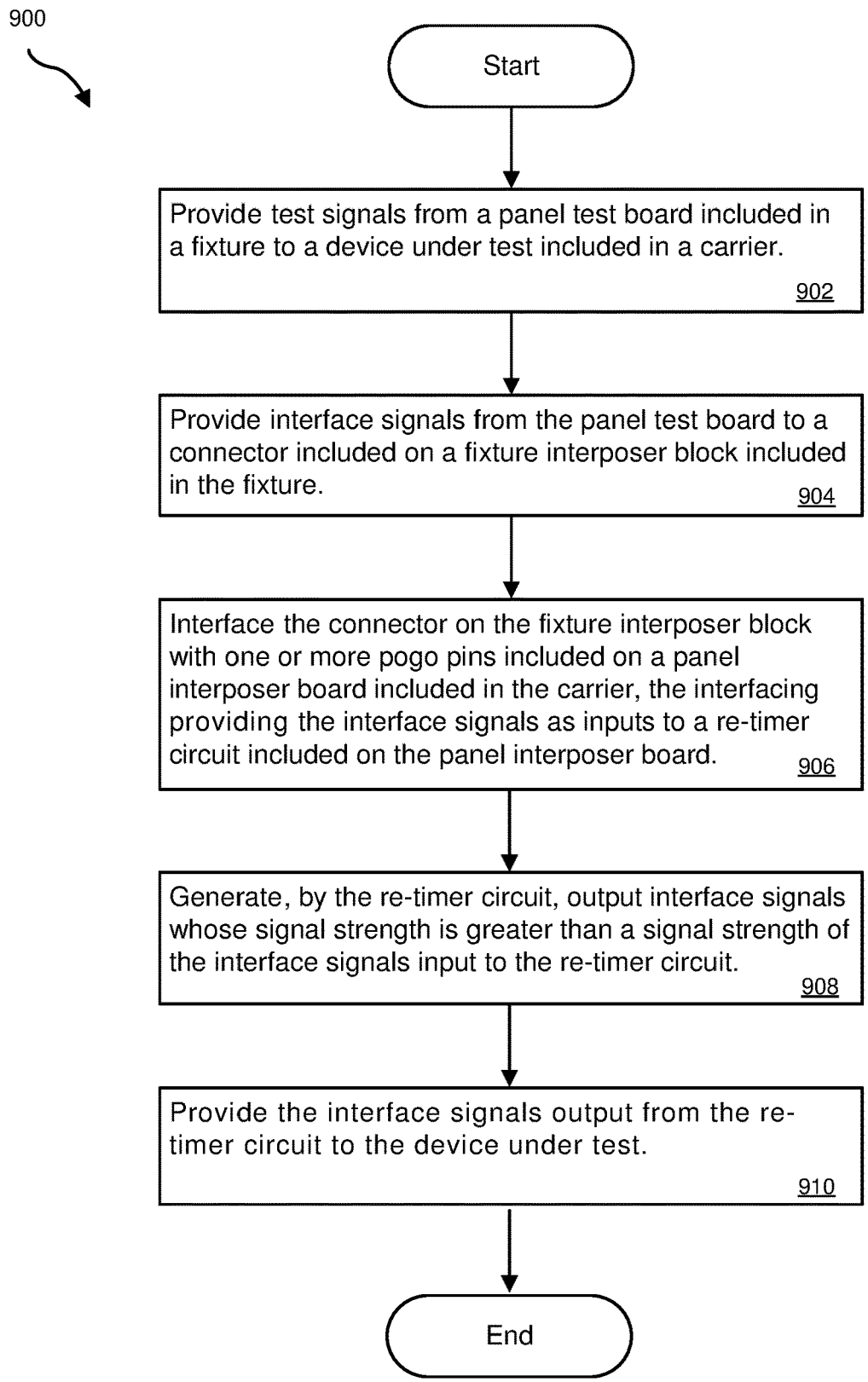
FIG. 9 is a flow diagram of an exemplary computer-implemented method for providing test signals from a test fixture to a device under test included on a carrier where an interposer board included on the test fixture interfaces with pogo pins on the carrier.

FIG. 9 is a flow diagram of an exemplary computer-implemented method 900 for providing test signals from a test fixture to a device under test included on a carrier where an interposer block included on the test fixture interfaces with pogo pins on the carrier. The steps shown in FIG. 9 may be performed by any suitable computer-executable code and/or computing system, including the system(s) illustrated in FIGS. 7 and 8. In one example, each of the steps shown in FIG. 9 may represent an algorithm whose structure includes and/or is represented by multiple sub-steps, examples of which will be provided in greater detail below.

As illustrated in FIG. 9, at step 902 one or more of the systems described herein may provide test signals from a panel test board included in a fixture to a device under test included in a carrier. For example, the test fixture 702 by way of the pogo connection 732 may provide one or more test signals (e.g., MIPI, power, and/or I/O signals) from the test fixture 702 to the device under test 740.

As illustrated in FIG. 9, at step 904 one or more of the systems described herein may provide interface signals from the panel test board to a connector included on a fixture interposer block included in the fixture. For example, the panel test board 706 may connect to (interface with) the header 712 included on the connection board 708. The connection board 708 may provide the first set of signals 714 to the first connector 718. The general flexible flat cable 726 connected between the first connector 718 and the third connector 730 may provide high current power signals to the interposer block 724. The connection board 708 may provide the second set of signals 716 to the second connector 720. The impedance controlled flexible flat cable 722 connected between the second connector 720 and the fourth connector 728 may provide MIPI, I/O, and/or general power signals to the interposer block 724.

As illustrated in FIG. 9, at step 906 one or more of the systems described herein may interface the connector on the fixture interposer block with one or more pogo pins included on a panel interposer board included in the carrier. The interfacing may provide the interface signals as inputs to a re-timer circuit included on the panel interposer board. For example, the one or more signals provided to the interposer block 724 by the third connector 730 and the fourth connector 728 may connect to (interface with) the one or more pogo pin(s) 734 by way of the pogo connection 732. One or more MIPI signals may be provided to the re-timer circuit 746 by way of the first connection 748.

As illustrated in FIG. 9, at step 908 one or more of the systems described herein may generate, by the re-timer circuit, output interface signals whose signal strength is greater than a signal strength of the interface signals input to the re-timer circuit. For example, the re-timer circuit 746 may strengthen (e.g., signal condition, amplify, etc.) the one or more MIPI signals received by way of the first connection 748, outputting the strengthened (e.g., amplified, conditioned) MIPI signals by way of the second connection 750.

As illustrated in FIG. 9, at step 910 one or more of the systems described herein may provide the interface signals output from the re-timer circuit to the device under test. For example, the MIPI signals included in the second connection 750 are provided to respective pins on the socket 738 that connects to (interfaces with) the device under test 740 by way of the board to board connection 742. Though described with reference to MIPI signals, in some implementations, the system 700 may be used to provide any type of test and/or interface signals from a test board to a device under test.

EXAMPLE EMBODIMENTS

Example 1: A system may include a fixture including a panel test board, a fixture connection board, and a fixture interposer block including at least one connector configured to interface with at least one pogo pin. The fixture connection board may provide an interface from the panel test board to the fixture interposer block. The system may further include a carrier including a panel interposer board connected to a device under test. The carrier may be interfaced with the fixture by way of contact of at least one pogo pin included in the panel interposer board with the at least one connector included in the fixture interposer block. The interfacing of the carrier with the fixture may provide at least one test signal from the panel test board to the device under test.

Example 2: The system of Example 1, where the carrier may further include a base plate, at least one fastener, and a buckle. The at least one fastener and the buckle may be configured to maintain the device under test within a first recess included in the base plate.

Example 3: The system of any of Examples 1 and 2, where the carrier may further include a press module and a press plate. The press module may be configured to place the press plate in a position within the carrier to maintain the panel interposer board within a second recess included in the base plate.

Example 4: The system of any of Examples 1, 2, and 3, where the fixture connection board may include a header used to connect the fixture connection board to the panel test board by way of a board to board connection.

Example 5: The system of any of Examples 1-4, where the fixture connection board may further include a first connector and a second connector.

Example 6: The system of any of Examples 1-5, where power signals received by the fixture connection board from the panel test board by way of the header may be separated into high current power signals and general power signals.

Example 7: The system of Examples 6, where the high current power signals may be directed to the first connector and the general power signals may be directed to the second connector.

Example 8: The system of any of Examples 1-7, where one or more input/output signals received by the fixture connection board from the panel test board by way of the header are directed towards the second connector.

Example 9: The system of any of Examples 1-8, where mobile industry processor interface (MIPI) signals received by the fixture connection board from the panel test board by way of the header may be directed towards the second connector.

Example 10: The system of any of Examples 1-9, where the fixture interposer block includes a third connector and a fourth connector.

Example 11: The system of any of Examples 1-10, where a general flexible flat cable connects the first connector to the third connector.

Example 12: The system of any of Examples 1-11, where an impedance controlled flexible flat cable connects the second connector to the fourth connector.

Example 13: The system of any of Examples 1-12, where one or more pogo connections between the fixture and the carrier may provide an interface between the fixture and the carrier.

Example 14: The system of any of Examples 1-13, where the panel interposer board may further include a re-timer circuit that improves a signal strength of each of one or more signals received from the panel test board by way of the one or more pogo connections. The improved one or more signals may be provided to the device under test by way of a board to board connection between the panel interposer board and the device under test.

Example 15: The system of any of Examples 1-14, where the one or more input/output signals, the high current power signals, and the general power signals received from the panel test board by way of the one or more pogo connections may be provided to the device under test by way of a board to board connection between the panel interposer board and the device under test.

Example 16: The system of any of Examples 1-15, where the device under test may be a display device.

Example 17: A computer-implemented method may include providing test signals from a panel test board included in a fixture to a device under test included in a carrier including providing interface signals from the panel test board to a connector included on a fixture interposer block included in the fixture, interfacing the connector on the fixture interposer block with one or more pogo pins included on a panel interposer board included in the carrier, the interfacing providing the interface signals as inputs to a re-timer circuit included on the panel interposer board, generating, by the re-timer circuit, output interface signals whose signal strength is greater than a signal strength of the interface signals input to the re-timer circuit, and providing the interface signals output from the re-timer circuit to the device under test.

Example 18. The computer-implemented method of Example 17, where the device under test is a display device, where the interface signals are mobile industry processor interface (MIPI) signals, where the MIPI is a D-PHY serial interface for the display device, and where the re-timer circuit is a MIPI D-PHY re-timer circuit.

Example 19. The computer-implemented method of Example 17, where the device under test is a liquid crystal display (LCD) device, where the interface signals are mobile industry processor interface (MIPI) signals, where the MIPI is a C-PHY interface for connecting a processor to the LCD device, and where the re-timer circuit is a MIPI C-PHY re-timer circuit.

Example 20. A device may include a base plate including a first recess and a second recess, at least one fastener, a buckle, a press module, a press plate, a device under test, and a panel interposer board including at least one pogo pin, a re-timer circuit, and a socket. The at least one fastener and the buckle may be configured to maintain the device under test within the first recess of the base plate. The press module may be configured to place the press plate in a position to maintain the panel interposer board within the second recess of the base plate. The panel interposer board may be interfaced with the device under test by way of a board to board connection between the device under test and the socket. The re-timer circuit may improve a signal strength of at least one signal provided to an input of the re-timer circuit from the least one pogo pin.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 1000 in FIG. 10. Other artificial-reality systems may include an NED that also provides visibility into the real world (e.g., augmented-reality system 1100 in FIG. 11) or that visually immerses a user in an artificial reality (e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 10:
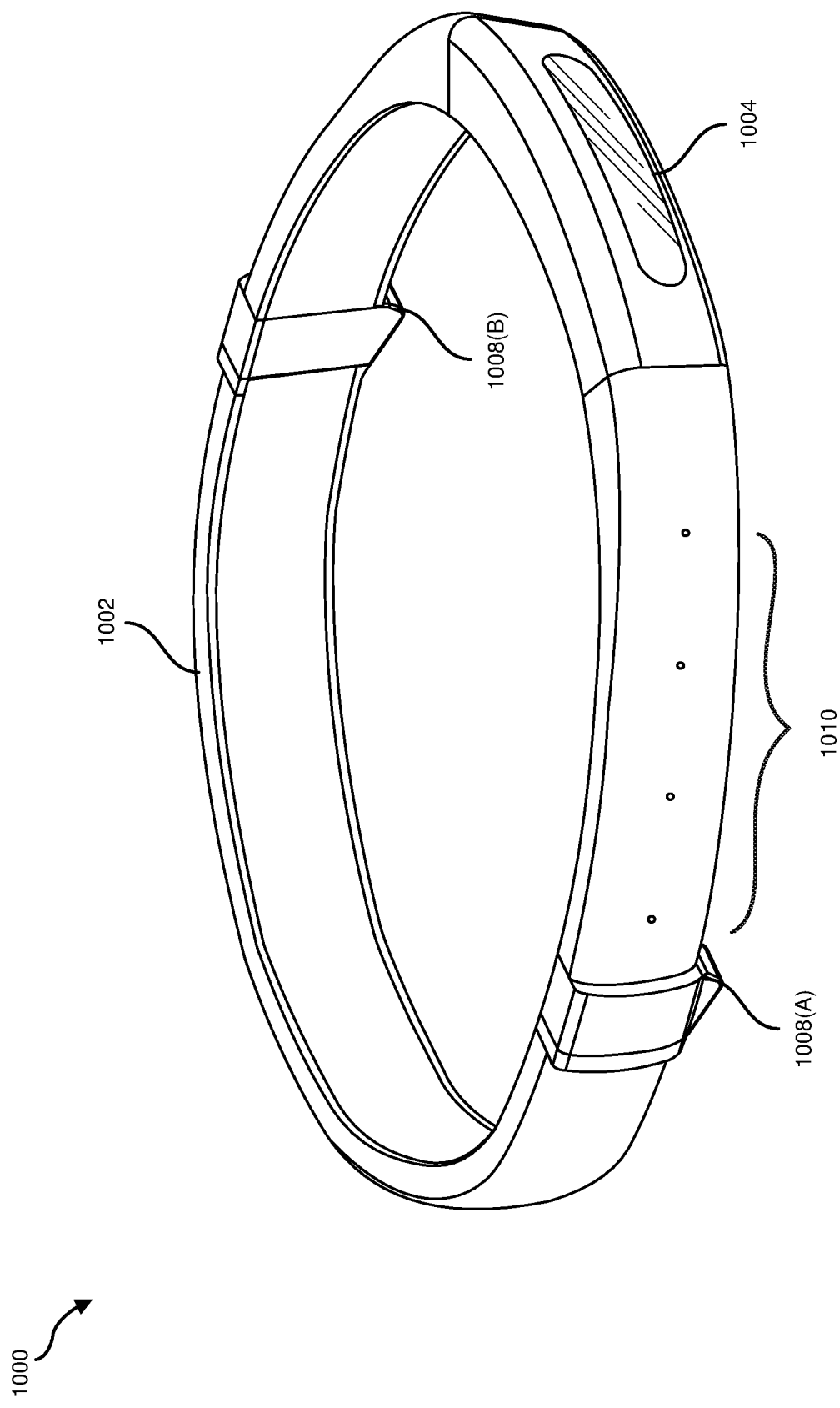
FIG. 10 is an illustration of an exemplary artificial-reality headband that may be used in connection with embodiments of this disclosure.

Turning to FIG. 10, augmented-reality system 1000 generally represents a wearable device dimensioned to fit about a body part (e.g., a head) of a user. As shown in FIG. 10, system 1000 may include a frame 1002 and a camera assembly 1004 that is coupled to frame 1002 and configured to gather information about a local environment by observing the local environment. Augmented-reality system 1000 may also include one or more audio devices, such as output audio transducers 1008(A) and 1008(B) and input audio transducers 1010. Output audio transducers 1008(A) and 1008(B) may provide audio feedback and/or content to a user, and input audio transducers 1010 may capture audio in a user's environment.

As shown, augmented-reality system 1000 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1000 may not include an NED, augmented-reality system 1000 may include other types of screens or visual feedback devices (e.g., a display screen integrated into a side of frame 1002).

Figure 11:
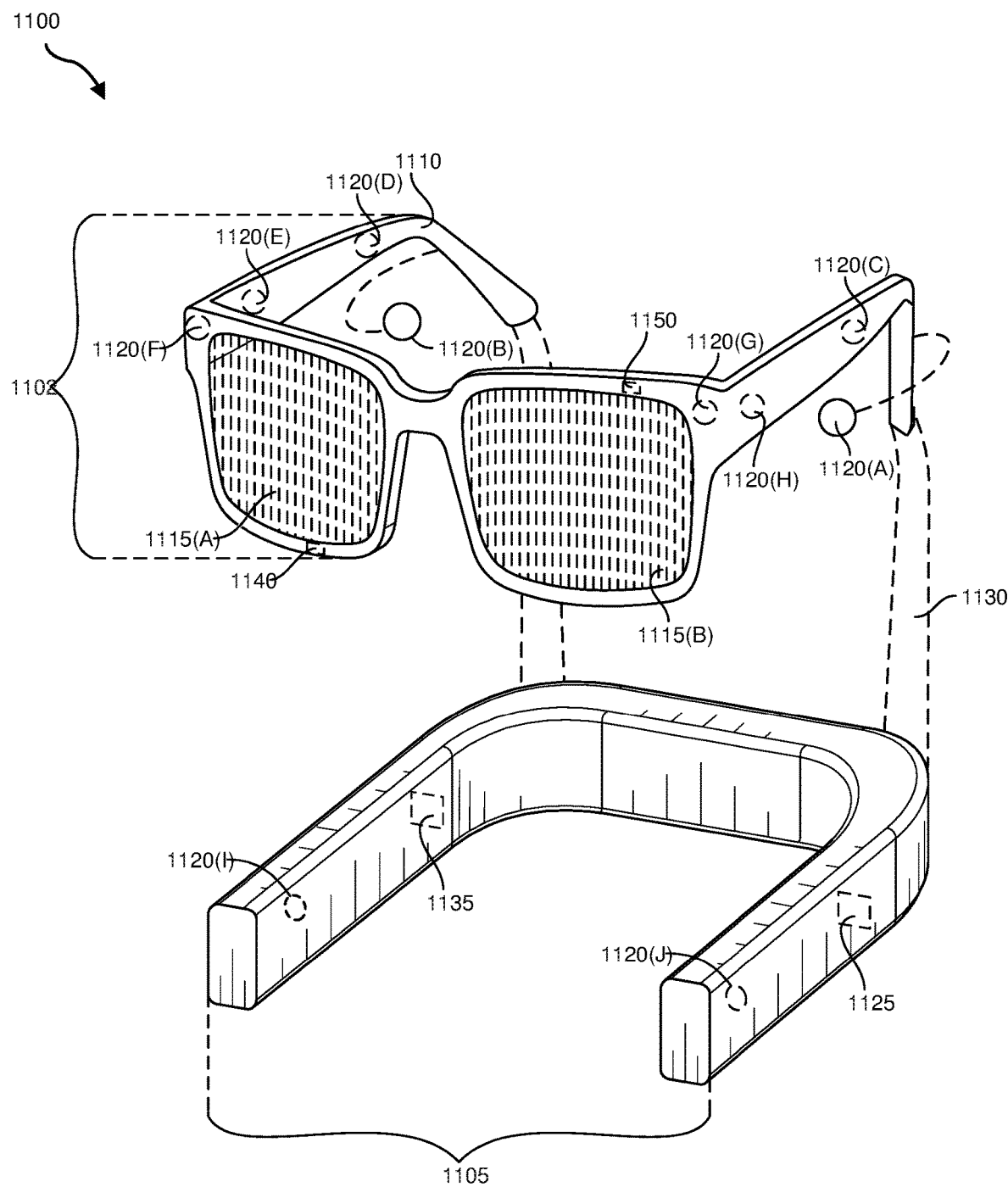
FIG. 11 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140. Sensor 1140 may generate measurement signals in response to motion of augmented-reality system 1100 and may be located on substantially any portion of frame 1110. Sensor 1140 may represent a position sensor, an inertial measurement unit (IMU), a depth camera assembly, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

Augmented-reality system 1100 may also include a microphone array with a plurality of acoustic transducers 1120(A)-1120(J), referred to collectively as acoustic transducers 1120. Acoustic transducers 1120 may be transducers that detect air pressure variations induced by sound waves. Each acoustic transducer 1120 may be configured to detect sound and convert the detected sound into an electronic format (e.g., an analog or digital format). The microphone array in FIG. 2 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(F) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by an associated controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer 1120, or some combination thereof.

Acoustic transducers 1120(A) and 1120(B) may be positioned on different parts of the user's ear, such as behind the pinna or within the auricle or fossa. Or, there may be additional acoustic transducers 1120 on or surrounding the ear in addition to acoustic transducers 1120 inside the ear canal. Having an acoustic transducer 1120 positioned next to an ear canal of a user may enable the microphone array to collect information on how sounds arrive at the ear canal. By positioning at least two of acoustic transducers 1120 on either side of a user's head (e.g., as binaural microphones), augmented-reality device 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments, acoustic transducers 1120(A) and 1120(B) may be connected to augmented-reality system 1100 via a wireless connection (e.g., a Bluetooth connection). In still other embodiments, acoustic transducers 1120(A) and 1120(B) may not be used at all in conjunction with augmented-reality system 1100.

Acoustic transducers 1120 on frame 1110 may be positioned along the length of the temples, across the bridge, above or below display devices 1115(A) and 1115(B), or some combination thereof. Acoustic transducers 1120 may be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers and other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(1) and 1120(J)) that are part of the microphone array (or potentially form their own microphone subarray). Neckband 1105 may also include a controller 1125 and a power source 1135.

Acoustic transducers 1120(1) and 1120(J) of neckband 1105 may be configured to detect sound and convert the detected sound into an electronic format (analog or digital). In the embodiment of FIG. 11, acoustic transducers 1120(1) and 1120(J) may be positioned on neckband 1105, thereby increasing the distance between the neckband acoustic transducers 1120(1) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on neckband 1105 and/or augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1100 and/or virtual-reality system 1200 may include one or more liquid crystal displays (LCDs), light emitting diode (LED) displays, organic LED (OLED) displays, and/or any other suitable type of display screen. As disclosed herein, the apparatus, systems, and methods described herein may be utilized when interfacing with a display panel. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 1100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 1000, augmented-reality system 1100, and/or virtual-reality system 1200 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 10 and 122, output audio transducers 1008(A), 1008(B), 1206(A), and 1206(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1010 may include condenser microphones, dynamic microphones, ribbon microphones, and/or any other type or form of input transducer. In some embodiments, a single transducer may be used for both audio input and audio output.

Figure 12:
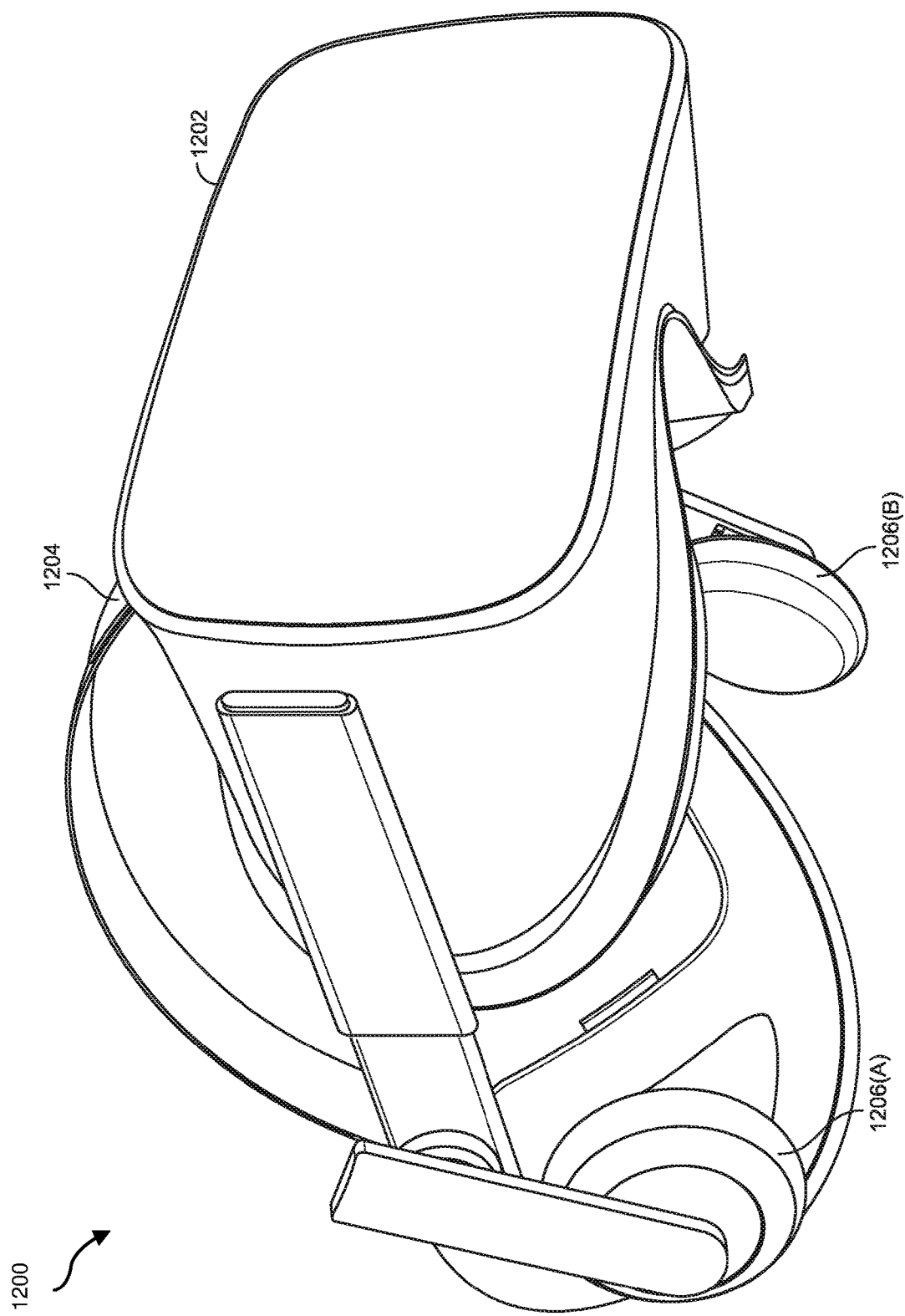
FIG. 12 is an illustration of an exemplary virtual-reality headset that may be used in connection with embodiments of this disclosure.

While not shown in FIGS. 10-12, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components)

connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
   a fixture including:
      a panel test board;
      a fixture connection board; and
      a fixture interposer block including at least one connector configured to interface with at least one pogo pin, the fixture connection board providing an interface from the panel test board to the fixture interposer block; and
   a carrier including a panel interposer board connected to a device under test, the carrier being interfaced with the fixture by way of contact of at least one pogo pin included in the panel interposer board with the at least one connector included in the fixture interposer block, the interfacing of the carrier with the fixture providing at least one test signal from the panel test board to the device under test, wherein the panel interposer board further includes a re-timer circuit that improves a signal strength of the at least one test signal received from the panel test board.

2. The system of claim 1, wherein the carrier further includes a base plate, at least one fastener, and a buckle, the at least one fastener and the buckle configured to maintain the device under test within a first recess included in the base plate.

3. The system of claim 2, wherein the carrier further includes a press module and a press plate, the press module configured to place the press plate in a position within the carrier to maintain the panel interposer board within a second recess included in the base plate.

4. The system of claim 1, wherein the fixture connection board includes a header used to connect the fixture connection board to the panel test board by way of a board to board connection.

5. The system of claim 4, wherein the fixture connection board further includes a first connector and a second connector.

6. The system of claim 5, wherein power signals received by the fixture connection board from the panel test board by way of the header are separated into high current power signals and general power signals.

7. The system of claim 6, wherein the high current power signals are directed to the first connector and the general power signals are directed to the second connector.

8. The system of claim 7, wherein one or more input/output signals received by the fixture connection board from the panel test board by way of the header are directed towards the second connector.

9. The system of claim 8, wherein mobile industry processor interface (MIPI) signals received by the fixture connection board from the panel test board by way of the header are directed towards the second connector.

10. The system of claim 9, wherein the fixture interposer block includes a third connector and a fourth connector.

11. The system of claim 10, wherein a general flexible flat cable connects the first connector to the third connector.

12. The system of claim 11, wherein an impedance controlled flexible flat cable connects the second connector to the fourth connector.

13. The system of claim 12, wherein one or more pogo connections between the fixture and the carrier provide an interface between the fixture and the carrier.

14. The system of claim 13, wherein the panel interposer board further includes a re-timer circuit that improves a signal strength of each of one or more signals received from the panel test board by way of the one or more pogo connections, the improved one or more signals being provided to the device under test by way of a board to board connection between the panel interposer board and the device under test.

15. The system of claim 13, wherein the one or more input/output signals, the high current power signals, and the general power signals received from the panel test board by way of the one or more pogo connections are provided to the device under test by way of a board to board connection between the panel interposer board and the device under test.

16. The system of claim 8, wherein the device under test is a display device.

17. A computer-implemented method comprising:
    providing test signals from a panel test board included in a fixture to a device under test included in a carrier comprising:
       providing interface signals from the panel test board to a connector included on a fixture interposer block included in the fixture;
       interfacing the connector on the fixture interposer block with one or more pogo pins included on a panel interposer board included in the carrier, the interfacing providing the interface signals as inputs to a re-timer circuit included on the panel interposer board;
       generating, by the re-timer circuit, output interface signals whose signal strength is greater than a signal strength of the interface signals input to the re-timer circuit; and
       providing the interface signals output from the re-timer circuit to the device under test.

18. The computer-implemented method of claim 17,
    wherein the device under test is a display device;
    wherein the interface signals are mobile industry processor interface (MIPI) signals;
    wherein the MIPI is a D-PHY serial interface for the display device; and
    wherein the re-timer circuit is a MIPI D-PHY re-timer circuit.

19. The computer-implemented method of claim 17,
    wherein the device under test is a liquid crystal display (LCD) device;
    wherein the interface signals are mobile industry processor interface (MIPI) signals;
    wherein MIPI is a C-PHY interface for connecting a processor to the LCD device; and
    wherein the re-timer circuit is a MIPI C-PHY re-timer circuit.

20. A device comprising:
    a base plate including a first recess and a second recess;
    at least one fastener;
    a buckle;
    a press module;
    a press plate;
    a device under test; and
    a panel interposer board comprising at least one pogo pin, a re-timer circuit, and a socket, wherein:
       the at least one fastener and the buckle are configured to maintain the device under test within the first recess of the base plate;

the press module is configured to place the press plate in a position to maintain the panel interposer board within the second recess of the base plate;

the panel interposer board is interfaced with the device under test by way of a board to board connection between the device under test and the socket; and the re-timer circuit improves a signal strength of at least one signal provided to an input of the re-timer circuit from the least one pogo pin.

\* \* \* \* \*